(12) United States Patent
McFadden et al.

(10) Patent No.: US 11,673,161 B2
(45) Date of Patent: Jun. 13, 2023

(54) METHODS OF MANUFACTURING ELECTROSTATIC CHUCKS

(71) Applicant: Technetics Group LLC, Charlotte, NC (US)

(72) Inventors: Angus McFadden, Charlotte, NC (US); Jason Wright, Charlotte, NC (US)

(73) Assignee: Technetics Group LLC, Charlotte, NC (US)

( * ) Notice: Subject to any disclaimer, the term of this patent is extended or adjusted under 35 U.S.C. 154(b) by 0 days.

(21) Appl. No.: 16/814,775

(22) Filed: Mar. 10, 2020

(65) Prior Publication Data
US 2020/0290081 A1    Sep. 17, 2020

Related U.S. Application Data

(60) Provisional application No. 62/816,687, filed on Mar. 11, 2019.

(51) Int. Cl.
*B05D 1/02*    (2006.01)
*B05D 1/00*    (2006.01)

(52) U.S. Cl.
CPC ............... *B05D 1/005* (2013.01); *B05D 1/02* (2013.01)

(58) Field of Classification Search
CPC .................................. B05D 1/005; B05D 1/02
See application file for complete search history.

(56) References Cited

U.S. PATENT DOCUMENTS

| | | | |
|---|---|---|---|
| 5,753,132 A * | 5/1998 | Shamouilian | H01L 21/6831 216/33 |
| 6,225,240 B1 | 5/2001 | You et al. | |
| 2002/0045011 A1 | 4/2002 | Nagashima | |
| 2008/0185738 A1 | 8/2008 | Chung et al. | |
| 2014/0042716 A1 | 2/2014 | Miura et al. | |
| 2014/0177123 A1 * | 6/2014 | Thach | H01L 21/6831 361/234 |
| 2014/0218711 A1 * | 8/2014 | Brinkhof | G03F 7/70691 355/72 |
| 2015/0022936 A1 * | 1/2015 | Cox | H05K 3/285 361/234 |
| 2016/0170314 A1 | 6/2016 | Lafarre et al. | |
| 2016/0268048 A1 | 9/2016 | Zelner et al. | |
| 2016/0336210 A1 * | 11/2016 | Cooke | H01L 21/6833 |
| 2017/0242345 A1 * | 8/2017 | Lipson | G03F 7/7095 |

OTHER PUBLICATIONS

PCT/US2020/021996 International Search Report and Written Opinion dated May 11, 2020, 9 pages total.
Extended European Search Report dated Dec. 16, 2022, European Application No. 20769276.5, 8 pgs.

\* cited by examiner

*Primary Examiner* — Austin Murata
(74) *Attorney, Agent, or Firm* — Perkins Coie LLP

(57) ABSTRACT

A method of depositing material to manufacture an electrostatic chuck is provided. The method first deposits at least one layer of a first dielectric material on a handle using spin coating and/or direct spraying method. A functional electric layer is next deposited on the at least one layer of the first dielectric material. Finally, the electrostatic chuck if formed by depositing at least one layer of a second dielectric material on the functional electric layer and the first dielectric material using spin coating and/or direct spraying method.

20 Claims, 4 Drawing Sheets

METHODS OF MANUFACTURING ELECTROSTATIC CHUCKS

CROSS-REFERENCE TO RELATED APPLICATIONS

This application claims the benefit of U.S. Provisional Application No. 62/816,687, entitled "METHODS OF MANUFACTURING ELECTROSTATIC CHUCKS," filed on Mar. 11, 2019, which is incorporated herein by reference in its entirety.

TECHNICAL FIELD

Described herein are methods of manufacturing an electrostatic chuck (ESC) in which at least a portion of the ESC is formed using spin coating or spraying techniques to deposit layers of the ESC on a handle.

BACKGROUND

With reference to FIG. 1, electrostatic chucks 100 typically include a handle or base plate 110 upon which multiple layers of a dielectric material are deposited to form the chuck body 120. Dispersed between adjacent layers of dielectric material may be patterned metal sheets 130 that serve as electrical components (e.g., electrodes, heaters, etc.).

Conventional means for manufacturing an ESC having the configuration described above generally include using tape casting techniques to form the multiple layers of dielectric material on the handle. With reference to FIG. 2, tape casting methods generally involve providing a moving belt onto which liquid dielectric material is dispersed from a reservoir. A doctor blade is used to ensure a constant height of the material dispersed from the reservoir on to the belt. As the dispersed material moves forward on the belt, it passes under a dryer in order to harden the material. Multiple tape casting passes can be used in order to build up the thickness of the chuck body.

Multiple issues arise out of the use of tape casting to manufacture portions of an ESC. The overall time required to manufacture an ESC is relatively long due to the slow nature of building up the chuck body using tape casting techniques. The tape casting process is also relatively complex. As such, the overall yield using these techniques is low, and the cost is relatively high.

Accordingly, a need exists for improved ESC manufacturing methods that resolve or mitigate some or all of the above described problems.

SUMMARY

Described herein are various embodiments of a method for manufacturing electrostatic chucks. In some embodiments, the method includes depositing at least one layer of a first dielectric material on a handle using spin coating and/or direct spraying, depositing a functional electric layer on the at least one layer of first dielectric material, and depositing at least one layer of a second dielectric material on the functional electric layer using spin coating and/or direct spraying. Additional optional steps, such as depositing a mechanical dielectric layer on the at least one layer of second dielectric material and patterning the mechanical dielectric layer, may also be carried out. In some embodiments, the material of the handle is $Al_2O_3$, AlN or $Y_2O_3$. In some embodiments, the first dielectric material and the second dielectric material are the same dielectric material, and the dielectric material is a material having a high dielectric constant. In some embodiments, the material of the mechanical dielectric layer is the same material as the handle.

DETAILED DESCRIPTION

Figure 1:
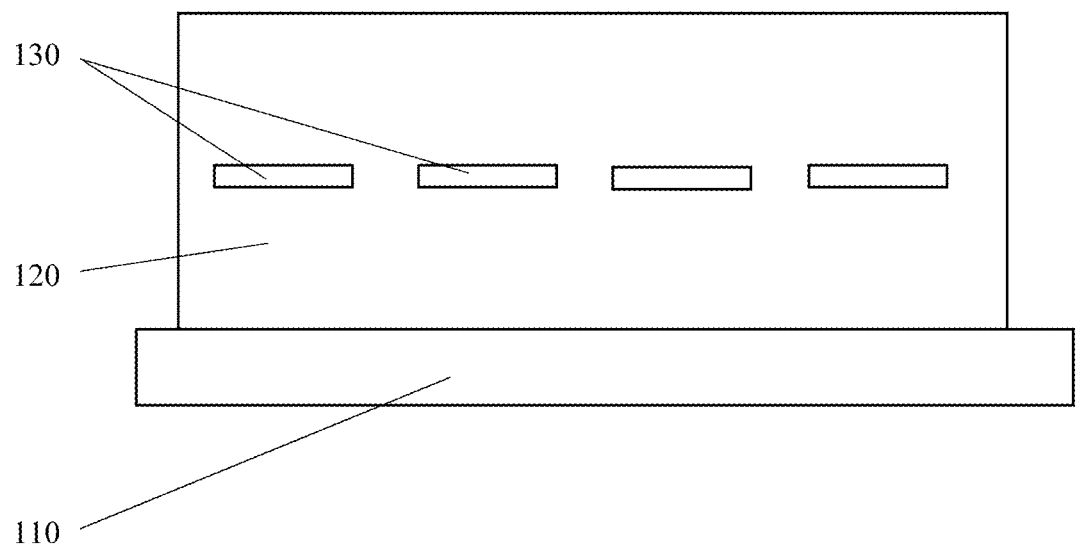
FIG. 1 illustrates a configuration of an electrostatic chuck according to the prior art.
Figure 2:
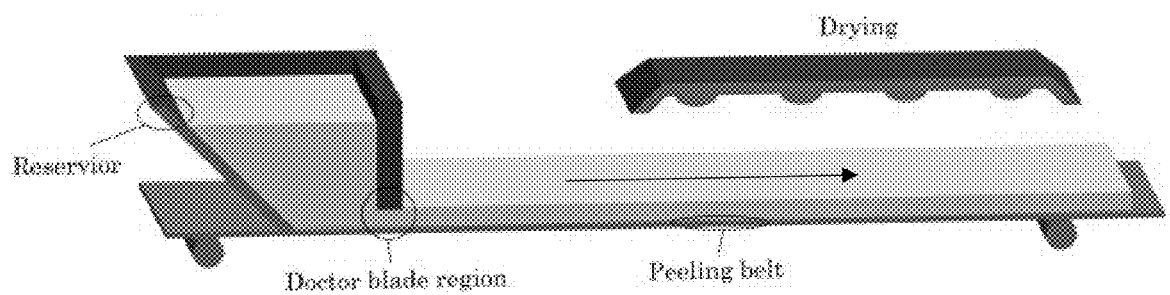
FIG. 2 illustrates a tape casting technique according to the prior art.
Figure 3:
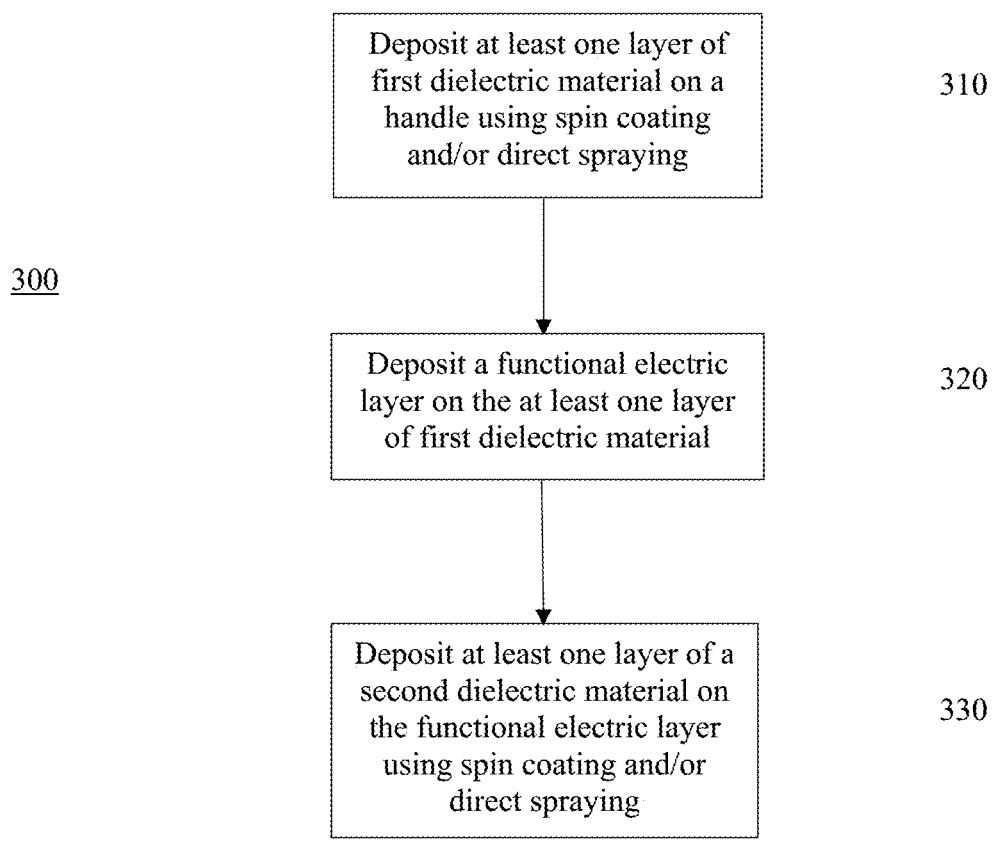
FIG. 3 is a flow diagram illustrating a method of manufacturing an electrostatic chuck according to various embodiments described herein.

With reference to FIG. 3, a method 300 for manufacturing an electrostatic chuck includes a step 310 of depositing at least one layer of first dielectric material on a handle using spin coating and/or direct spraying, a step 320 of depositing a functional electric layer on the at least one layer of a first dielectric material, and a step 330 of depositing at least one layer of a second dielectric material on the functional electric layer using spin coating and/or direct spraying.

In step 310, at least one layer of a first dielectric material is deposited on a handle using spin coating and/or direct spraying. Spin coating techniques generally call for a small amount of liquid dielectric material to be applied to the center of the handle, followed by rotating the handle at relatively high speeds in order to spread the liquid dielectric material by centrifugal force. Any apparatus known to be suitable for carrying out spin coating (e.g., a spin coater or a spinner) may be used. Similarly, any suitable rotating speed that causes the dielectric material to spread may be used. The amount of material applied to the center of the handle is not limited and is generally determined based on the desired thickness of the layer being formed on the handle. In the event multiple layers of first dielectric material are deposited on the handle, the first layer is deposited directly on the handle using spin coating, and subsequent layers are formed on the preceding layer of dielectric material using spin coating.

Direct spraying may generally be carried out using a spray gun. The spray gun is loaded with the liquid dielectric material and is then used to spray the liquid dielectric material directly onto the handle (or preceding layer of dielectric material when multiple layers are deposited). The direct spraying is generally carried out such that the layer of material deposited has a uniform thickness.

Regardless of whether spin coating or direct spraying is used, the deposited layer will generally be cured after deposition in order to harden the material. Any suitable curing technique and parameters may be used. In some embodiments, the deposited material is cured by heating the material at a temperature of 600° C. or higher.

When multiple layers of first dielectric material are deposited, the deposition method may be exclusively spin coating, exclusively direct spraying, or some layers may be deposited using spin coating while other layers are deposited using direct spraying.

The first dielectric material is generally not limited and may be any material known to be suitable for use as the chuck body of an ESC. In some embodiments, the first dielectric material is a dielectric material having a dielectric constant higher than 3. In some embodiments, the first dielectric material having a dielectric constant higher than 3 is a siloxane-based material. Such dielectric materials may further include a metal oxide component, such as $Al_2O_3$. However, a metal oxide component is not required. The high dielectric constant dielectric material can be made up of an oxide, nitride, boride, carbide or fluoride of any combination of yttrium, iridium, scandium, erbium, hafnium, silicon carbide, zirconium oxide, or any lanthanoid. However, such compounds are not required.

The handle (also sometimes referred to as a plate or base plate) on which the first layer of first dielectric material is deposited may be made of any material known to be suitable for use as a handle of an ESC. In some embodiments, the material of the handle is a ceramic material. Exemplary ceramic materials include, but are not limited to, $Al_2O_3$, AlN and $Y_2O_3$. Other suitable materials can be glass or silicon.

Step 310 is carried out until the desired thickness of the first portion of the ESC is obtained. The desired thickness can be reached by depositing a single layer of first dielectric material having the desired thickness or by depositing multiple layers of the first dielectric material such that the thickness of the individual layers adds up to the desired overall thickness.

After a desired thickness has been reached, step 320 is performed, in which a functional electric layer is deposited on the layer or layers of first dielectric material. Any material known to be suitable for use as a functional electric layer in an ESC can be used. In some embodiments, the material is a metal material. The thickness of the metal layer is generally not limited and can be selected based on the electrical component being formed. The manner of forming the electrical layer can be, for example, via known PVD methods or by screen printing. The electric layer can be patterned as desired using any known patterning techniques.

After the functional electric layer has been deposited on the layer or layers of first dielectric material, step 330 is performed, in which at least one layer of a second dielectric material is deposited on top of the functional electric layer. The at least one layer of second dielectric material is deposited on the functional electric layer using the same spin coating and/or direct spraying techniques as described above with respect to step 310. As with step 310, a single layer or multiple layers of second dielectric material can be deposited, so long as the desired thickness of the second portion of the chuck body is achieved. In some embodiments, the second dielectric material is the same as the first dielectric material.

In some embodiments, steps 310, 320 and 330 may be repeated more than once such that the ESC includes multiple functional electric layers sandwiched between dielectric layers.

Optional additional manufacturing steps can be carried out after completion of steps 310, 320 and 330. For example, in some embodiments, a mechanical dielectric layer is formed on top of the at least one layer of second dielectric material. This mechanical dielectric layer serves as a sort of cap to the ESC structure. Any manner of depositing the mechanical dielectric layer on the at least one layer of second dielectric material can be used, including deposition via plasma spray, PVD, or a bonding process using ultra thin material. The material of the mechanical dielectric layer is not limited. In some embodiments, the mechanical dielectric layer is the same material as the handle. Thus, for example, when the handle is made from $Al_2O_3$, AlN or $Y_2O_3$, the mechanical dielectric material can be made from the same $Al_2O_3$, AlN or $Y_2O_3$ material.

In embodiments where a mechanical dielectric layer is employed, the manufacturing method can further include a patterning step wherein the mechanical dielectric layer is patterned based on the desired application. Any suitable patterning techniques can be used, such as subtractive manufacturing. In a specific example, CNC grinding can be used to form helium channels, mesas, etc. on top of which the wafers can rest during use of the ESC.

Figure 4:
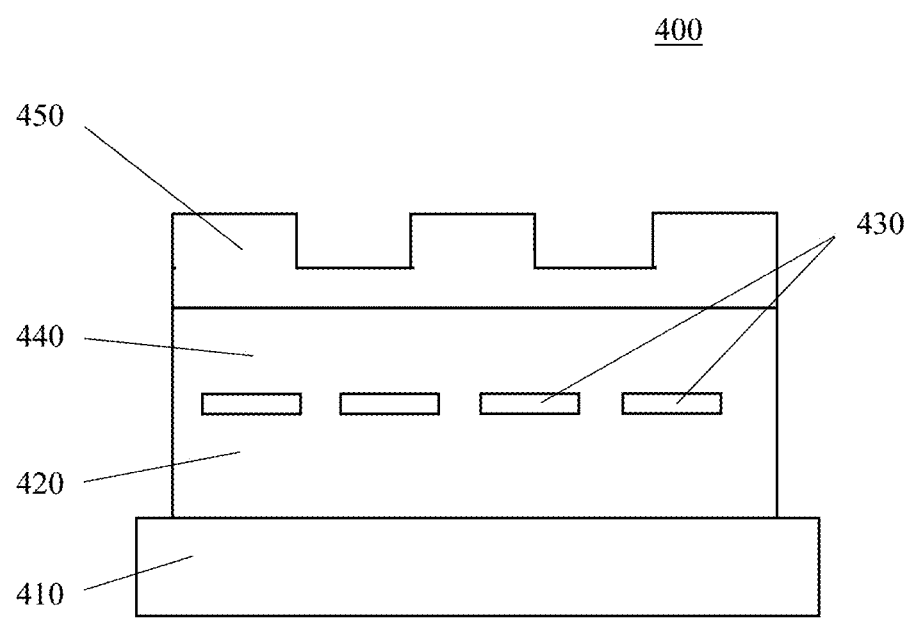
FIG. 4 illustrates an electrostatic chuck manufactured in accordance with methods described herein.

With reference to FIG. 4, an ESC 400 manufactured in accordance with the methods described above is shown. The ESC 400 includes a handle 410 on top of which is deposited a layer 420 of first dielectric material. While FIG. 4 shows a single layer, it should be appreciated that layer 420 may actually be made of up several layers. On top of layer 420 is a patterned functional electric layer 430. On top of functional electric layer 430 is a layer 440 of the second dielectric material. While FIG. 4 shows a single layer, it should be appreciated that layer 440 may actually be made up of several layers. On top of layer 440 is patterned mechanical dielectric layer 450. While FIG. 4 shows a single layer 420, a single layer 430 and a single layer 440, it should be appreciated that the ESC could include one or more repeated stacks of layers 420, 430 and 440 on top of the stack shown in FIG. 4.

The ESC manufacturing methods described herein can provide numerous benefits over previously known ESC manufacturing methods. For example, the disclosed method utilizing spin coating and/or spraying reduces manufacturing costs as compared to methods that employ tape casting. Additionally, the ESC produced by manufacturing methods described herein may also have improved characteristics as compared to an ESC manufactured by previously known methods. For example, the ESC produced by the methods described herein may provide increased clamp force, reduced ESC voltage (which reduces electrostatic particle attraction), reduced electron mobility to improve chucking and dechucking performance at high temperatures, reduced or eliminated residual charging (which is also related to improved chucking and dechucking performance at high temperatures), increased operating temperatures, increased thermal response, and/or high heat flow.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method of manufacturing an electrostatic chuck, comprising:
   providing a handle wherein the handle is formed from a ceramic material;
   depositing a layer of a first dielectric material on the handle using a depositing method selected from the group of depositing methods consisting of: spin coating, direct spray coating, or a combination thereof, wherein the first dielectric material is selected from the group of dielectric material consisting of yttrium, iridium, scandium, erbium, hafnium, silicon carbide, zirconium oxide, a lanthanoid, or a combination thereof;
   curing the deposited layer of the first dielectric material at a temperature of at least 600° C.;
   depositing a functional electric layer on the layer of the first dielectric material;

depositing one or more layers of a second dielectric material on the combination of the layer of the first dielectric material and the functional electric layer using a depositing method selected from the group of depositing methods consisting of: spin coating, direct spray coating, or a combination thereof, wherein the second dielectric material is selected from the group of dielectric material consisting of yttrium, iridium, scandium, erbium, hafnium, silicon carbide, zirconium oxide, a lanthanoid, or a combination thereof;

curing the deposited layer of the second dielectric material at the temperature of at least 600° C.;

depositing a mechanical dielectric layer on an outermost layer of the second dielectric material, wherein the mechanical dielectric layer is formed from the same ceramic material as used for forming the handle; and patterning the mechanical dielectric layer to increase an exposed surface area of an outermost surface of the mechanical dielectric layer, such that the outermost surface of the mechanical dielectric layer after the patterning step covers the entire outermost layer of the second dielectric material, wherein the outermost layer of the second dielectric material is not exposed.

2. The method of claim 1, wherein the first dielectric material is identical to the second dielectric material.

3. The method of claim 2, wherein the first dielectric material and the second dielectric material are a high dielectric constant material.

4. The method of claim 1, wherein the first dielectric material and the second dielectric material both have a dielectric constant greater than 3.

5. The method of claim 1, wherein depositing the layer of the first dielectric material comprises spin coating and wherein the spin coating comprises:
applying a liquid dielectric material on the handle; and
rotating the handle at a velocity to spread the liquid dielectric material by centrifugal force.

6. The method of claim 1, wherein depositing the layer of the first dielectric material comprises depositing the layer of the first dielectric material via direct spray coating.

7. The method of claim 1, wherein depositing and curing the layer of the first dielectric material comprises depositing and curing a plurality of layers of the first dielectric material.

8. The method of claim 7, wherein depositing and curing the plurality of layers of the first dielectric material all use spin coating.

9. The method of claim 7, wherein depositing and curing the plurality of layers of the first dielectric material all use direct spray coating.

10. The method of claim 7, wherein depositing and curing the plurality of layers of the first dielectric material has at least one of the plurality of layers deposited using spin coating and at least one of the plurality of layers deposited using direct spray coating.

11. The method of claim 1, wherein depositing and curing the layer of the second dielectric material comprises depositing and curing a plurality of layers of the second dielectric material.

12. The method of claim 11, wherein depositing and curing the plurality of layers of the second dielectric material all use spin coating.

13. The method of claim 11, wherein depositing and curing the plurality of layers of the second dielectric material all use direct spray coating.

14. The method of claim 11, wherein depositing and curing the plurality of layers of the second dielectric material has at least one of the plurality of layers deposited using spin coating at least one of the plurality of layers deposited using direct spray coating.

15. The method of claim 1, wherein the outermost surface of the mechanical dielectric layer extends continuously along an x-dimension and a y-dimension of the outermost layer of the second dielectric material.

16. The method of claim 1, wherein depositing the mechanical dielectric layer comprises depositing the mechanical dielectric layer directly on the outermost layer of the second dielectric material.

17. The method of claim 1, wherein patterning the mechanical dielectric layer comprises etching a plurality of regions within the mechanical dielectric layer, wherein each of the etched regions extends to an intermediate region of the mechanical dielectric layer.

18. A method of manufacturing an electrostatic chuck, comprising:
providing a ceramic substrate, wherein the ceramic substrate is selected from a group of ceramic substrate materials consisting of aluminum oxide, aluminum nitride, or yttrium oxide;

depositing and curing at a temperature of at least 600° C. a first dielectric material over the ceramic substrate via spin coating and/or direct spray coating, wherein the first dielectric material has a corresponding first outermost surface, wherein the first dielectric material is selected from the group of dielectric material consisting of yttrium, iridium, scandium, erbium, hafnium, silicon carbide, zirconium oxide, a lanthanoid, or a combination thereof;

depositing a functional material comprising a metal over a portion of the outermost surface of the first dielectric material;

depositing and curing at the temperature of at least 600° C. a second dielectric material over the functional material via spin coating and/or direct spray coating, wherein the second dielectric material has a corresponding second outermost surface, wherein the second dielectric material is selected from the group of dielectric material consisting of yttrium, iridium, scandium, erbium, hafnium, silicon carbide, zirconium oxide, a lanthanoid, or a combination thereof;

depositing a third ceramic dielectric material, wherein the third ceramic dielectric material comprises the same ceramic as the ceramic substrate over the second dielectric material, wherein the third ceramic dielectric material has a corresponding third outermost surface; and after depositing the third ceramic dielectric material, patterning the third ceramic dielectric material to increase an exposed surface area of the third outermost surface, the third dielectric material after being patterned covers all of the second outermost surface, wherein the second outermost surface extends continuously along an x-dimension and a y-dimension of the third dielectric material.

19. The method of claim 18, wherein depositing the third ceramic dielectric material comprises depositing the third ceramic dielectric material directly on the second outermost layer.

20. The method of claim 18, wherein patterning the third ceramic dielectric material comprises etching a plurality of regions within the third ceramic dielectric material, wherein each of the etched regions includes opposing sidewalls and a base surface extending between the opposing sidewalls, the opposing sidewalls extending to an intermediate region of the third ceramic dielectric material.

\* \* \* \* \*